(12) United States Patent
Doan et al.

(10) Patent No.: US 7,316,761 B2
(45) Date of Patent: Jan. 8, 2008

(54) APPARATUS FOR UNIFORMLY ETCHING A DIELECTRIC LAYER

(75) Inventors: Kenny L. Doan, San Jose, CA (US); Yunsang Kim, San Jose, CA (US); Mahmoud Dahimene, Gaithersburg, MD (US); Jingbao Liu, Sunnyvale, CA (US); Bryan Pu, San Jose, CA (US); Hongqing Shan, Cupertino, CA (US); Don Curry, Meridian, ID (US)

(73) Assignee: Applied Materials, Inc., Santa Clara, CA (US)

( * ) Notice: Subject to any disclaimer, the term of this patent is extended or adjusted under 35 U.S.C. 154(b) by 323 days.

(21) Appl. No.: 10/357,652

(22) Filed: Feb. 3, 2003

(65) Prior Publication Data

US 2004/0149394 A1   Aug. 5, 2004

(51) Int. Cl.
*H01L 21/306* (2006.01)
*H01L 21/3065* (2006.01)
*C23C 16/00* (2006.01)
*C23C 16/455* (2006.01)
*C23C 16/50* (2006.01)
*C23C 16/503* (2006.01)

(52) U.S. Cl. .............. 156/345.47; 118/715; 118/723 E; 156/345.34; 156/345.43

(58) Field of Classification Search ............... 118/715, 118/723 E; 156/345.33, 345.34, 345.43, 156/345.47
See application file for complete search history.

(56) References Cited

U.S. PATENT DOCUMENTS

| | | |
|---|---|---|
| 4,230,515 A | 10/1980 | Zajac |
| 4,307,283 A | 12/1981 | Zajac |
| 4,340,462 A | 7/1982 | Koch |
| 4,342,901 A | 8/1982 | Zajac |
| 4,600,464 A | 7/1986 | Desilets et al. |
| 4,767,641 A * | 8/1988 | Kieser et al. ............... 427/569 |
| 4,931,136 A | 6/1990 | Pausch et al. |
| 4,983,253 A | 1/1991 | Wolfe et al. ................ 156/643 |
| 5,113,790 A * | 5/1992 | Geisler et al. ........... 118/723 E |
| 5,269,847 A | 12/1993 | Anderson et al. |
| 5,346,579 A | 9/1994 | Cook et al. .................. 156/345 |
| 5,423,936 A * | 6/1995 | Tomita et al. .......... 156/345.34 |
| 5,455,070 A | 10/1995 | Anderson et al. |
| 5,458,724 A | 10/1995 | Syverson et al. |
| 5,494,713 A * | 2/1996 | Ootuki ....................... 427/579 |

(Continued)

FOREIGN PATENT DOCUMENTS

JP         63-17530         1/1988

(Continued)

OTHER PUBLICATIONS

Full copy of Korean Patent Publication 2001-00019302 originally cited in IDS of Jun. 2003.*

(Continued)

*Primary Examiner*—Jeffrie R Lund
(74) *Attorney, Agent, or Firm*—Patterson & Sheridan LLP

(57) ABSTRACT

Apparatus for plasma etching a layer of material upon a substrate comprising an anode having a first region protruding from a second region, wherein the second region defines a plane and the first region extends from said plane. In one embodiment, at least one solenoid is disposed near the apparatus to magnetize the plasma.

20 Claims, 5 Drawing Sheets

U.S. PATENT DOCUMENTS

| | | | |
|---|---|---|---|
| 5,597,439 A | 1/1997 | Salzman | |
| 5,647,911 A * | 7/1997 | Vanell et al. | 118/715 |
| 5,685,949 A * | 11/1997 | Yashima | 438/694 |
| 5,718,795 A | 2/1998 | Plavidal et al. | 156/345 |
| 5,824,605 A * | 10/1998 | Chen et al. | 438/729 |
| 5,959,409 A * | 9/1999 | Dornfest et al. | 315/111.21 |
| 5,990,016 A | 11/1999 | Kim et al. | |
| 6,010,636 A | 1/2000 | Donohue et al. | |
| 6,015,476 A * | 1/2000 | Schlueter et al. | 156/345.46 |
| 6,041,733 A * | 3/2000 | Kim et al. | 118/723 E |
| 6,089,183 A * | 7/2000 | Imai et al. | 118/723 E |
| 6,143,125 A * | 11/2000 | Shoji | 156/345.25 |
| 6,228,208 B1 | 5/2001 | Lill et al. | 156/345 |
| 6,331,754 B1 * | 12/2001 | Satoyoshi et al. | 315/111.51 |
| 6,363,882 B1 | 4/2002 | Hao et al. | 118/723 E |
| 6,387,208 B2 * | 5/2002 | Satoyoshi et al. | 156/345.37 |
| 6,412,437 B1 * | 7/2002 | Campbell et al. | 118/723 E |
| 6,477,980 B1 * | 11/2002 | White et al. | 118/723 E |
| 6,596,653 B2 * | 7/2003 | Tan et al. | 438/788 |
| 6,716,302 B2 * | 4/2004 | Carducci et al. | 156/345.47 |
| 6,805,952 B2 * | 10/2004 | Chang et al. | 428/334 |
| 6,808,759 B1 * | 10/2004 | Okumura et al. | 427/569 |
| 6,818,096 B2 * | 11/2004 | Barnes et al. | 156/345.43 |
| 6,857,387 B1 * | 2/2005 | Sun et al. | 118/723 E |
| 6,872,258 B2 * | 3/2005 | Park et al. | 118/715 |
| 2001/0022293 A1 * | 9/2001 | Maeda et al. | 216/67 |
| 2002/0192370 A1 * | 12/2002 | Metzner et al. | 427/248.1 |
| 2004/0149394 A1 * | 8/2004 | Doan et al. | 156/916 |
| 2005/0011453 A1 * | 1/2005 | Okumura et al. | 118/723 E |
| 2005/0064248 A1 * | 3/2005 | O'Donnell et al. | 428/702 |

FOREIGN PATENT DOCUMENTS

KR   2001-019302   3/2001

OTHER PUBLICATIONS

Translation of Korean Patent 1020010019302.*

* cited by examiner

US 7,316,761 B2

APPARATUS FOR UNIFORMLY ETCHING A DIELECTRIC LAYER

BACKGROUND OF THE INVENTION

1. Field of the Invention

The present invention generally relates to semiconductor substrate processing systems. More specifically, the present invention relates to an apparatus for performing an etch process in a semiconductor substrate processing system.

2. Description of the Related Art

Reactive ion etch (RIE) is an important process in fabrication of integrated circuit (IC) devices. The RIE process is a plasma etch process that is performed in a chamber where a semiconductor substrate (e.g., a silicon (Si) wafer) is disposed on a substrate pedestal that is coupled to a source of radio-frequency (RF) power. Such chamber is generally referred to as a RIE chamber.

In the RIE chamber, application of the RF power to the substrate pedestal results in energizing an etchant gas to form a plasma that etches a material layer on a surface of the wafer, e.g., a low-K dielectric material such as an organic doped silicon glass (OSG). One major problem associated with the RIE process is that distribution of the plasma in the conventional RIE chamber is non-uniform due to a wafer edge effect and, as such, the etch rate across the wafer is non-uniform. More specifically, the etch rate at locations near an edge of the wafer is higher than the etch rate for points near a center of the wafer.

During fabrication of advanced IC devices using a dual damascene technique, the etch rate non-uniformity generally should be less than 5%. Herein the etch rate non-uniformity is defined as expressed in percent units ratio of a difference between the maximal and minimal etch rate within the substrate to a sum of such maximal and minimal etch rates.

Many attempts have been conducted to reduce the etch rate non-uniformity during the RIE process, including modifying an etchant gas distribution pattern in the chamber, substrate pedestal design, and the like. Other attempts to improve the etch rate non-uniformity have been focused on magnetizing a plasma in the RIE chamber, e.g., using solenoids or permanent magnets disposed around or above the chamber. Such RIE chamber with a magnetized plasma is known in the art as a magnetically enhanced reactive ion etch (MERIE) chamber.

While various methods of the prior art have demonstrated that the etch rate non-uniformity can be improved, specifically using the MERIE chamber, the etch rate non-uniformity remains about 10% for most applications related to etching the dielectric materials.

Therefore, there is a need in the art for an apparatus for etching, with low non-uniformity, a layer of a dielectric material during fabrication of an IC device.

SUMMARY OF THE INVENTION

The present invention is a method and apparatus for plasma etching, with low non-uniformity, a material layer upon a substrate in a process chamber comprising an anode electrode having a region positioned closer to a substrate pedestal than other regions of the anode. In one embodiment, the chamber forms a plasma through capacitive coupling and at least one plasma magnetizing solenoid is disposed near the chamber.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only typical embodiments of this invention and are therefore not to be considered limiting of its scope, for the invention may admit to other equally effective embodiments.

DETAILED DESCRIPTION

The present invention is an apparatus for plasma etching, with low non-uniformity. In one embodiment, the apparatus generally is a magnetically enhanced reactive ion etch (MERIE) chamber that comprises an anode electrode having a region that is nearer to the etched substrate than another region of the electrode.

Figure 1:
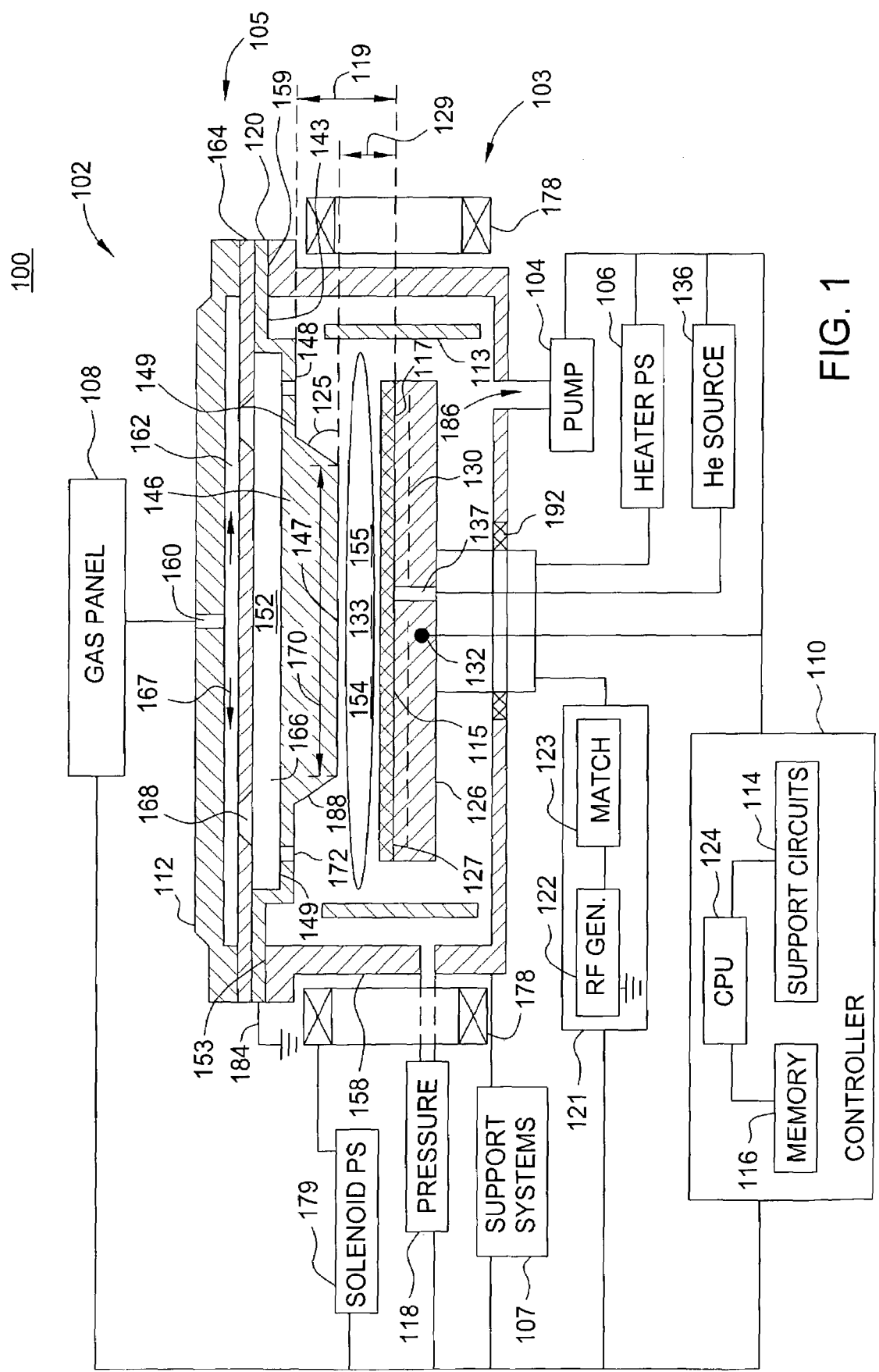
FIG. 1 depicts a schematic cross-sectional diagram of a plasma processing apparatus in accordance with the present invention.

FIG. 1 depicts a schematic diagram of an exemplary reactor 100 comprising an anode electrode in accordance with the present invention. The images in FIG. 1 are simplified for illustrative purposes and are not depicted to scale. An example of a reactor that can used to perform the invention is the eMAX® reactor, available from Applied Materials, Inc. of Santa Clara, Calif. The eMAX® reactor is disclosed in commonly assigned U.S. Pat. No. 6,113,731, issued Sep. 5, 2000, which is incorporated herein by reference. It should be noted that other RIE and MERIE reactors and chambers may also be used to practice the invention.

The reactor 100 comprises a process chamber 102, a gas panel 108, a source 136 of backside gas, a power supply 106, a vacuum pump 104, a support systems 107, and a controller 110. Further, the reactor 100 comprises a source 121 of RF bias and at least one plasma magnetizing solenoid 178, coupled to a power supply 179. As such, in the depicted embodiment, the process chamber 102 is a MERIE chamber, however, in other embodiments the chamber 102 can be a RIE chamber.

The process chamber 102 generally is a vacuum vessel, which comprises a first portion 103 and a second portion 105. In one embodiment, the first portion 103 is coupled to the vacuum pump 104 and houses a substrate pedestal 126 and protective lining 113. The second portion 105 is coupled to the gas panel 108 and comprises a lid 112, an optional blocking plate 164, and a gas distribution plate (showerhead) 120. The showerhead 120 defines a gas mixing volume 152 and a reaction volume 154.

The substrate pedestal 126 is used to support a substrate 128 (e.g., a 300 mm silicon (Si) wafer). Herein the terms substrate and wafer are used interchangeably. In one embodiment, the substrate pedestal 126 comprises an embedded heater 130 to control a temperature of the substrate pedestal. Alternatively, the substrate pedestal 126 may comprise a source of radiant heat (not shown), such as gas-filled lamps and the like. An embedded temperature sensor 132, e.g., a thermocouple, monitors, in a conventional manner, the temperature of the pedestal. The measured temperature is used in a feedback loop to regulate the output of the power supply 106 coupled to the heater 130 or, alternatively, the gas-filled lamps.

The substrate pedestal 126 further comprises a gas supply conduit 137, which is adapted to the grooves (not shown) in a support surface 127 of the pedestal 126. Gas, e.g., helium, may be provided from the source 136 to a backside of the wafer 128 through the conduit 137 into the grooves. The backside gas facilitates heat exchange between the substrate pedestal 126 and the wafer 128. Using the backside gas, a temperature of the wafer 128 may generally be controlled between −20 and 60 degrees Celsius.

Process gas (or gas mixture) 133 is delivered from the gas panel 108 into the process chamber 102 through an inlet port 160. Herein the terms gas and gas mixture are used interchangeably. In one embodiment, the inlet port 160 is fluidly connected to a first plenum 162 of the gas mixing volume 152, where the process gas 133 diffuses radially across the optional blocking plate 164 as indicated by arrows 167. The process gas 133 through apertures 168 in the blocking plate 164 enter a second plenum 166 formed between the showerhead 120 and the blocking plate 164. The showerhead 120 fluidly connects the second plenum 166 to the reaction volume 154 via a plurality of apertures (gas injectors) 172.

The showerhead 120 may comprise different zones such that various gases can be released into the reaction volume 154 at various flow rates. The depicted embodiment comprises four gas injectors 172 and four apertures 168. However, in other embodiments of the invention, a number of the gas injectors and apertures may be either greater or less than four. Similarly, the location and angular orientation of the injectors and the apertures may be different from the illustrative example depicted in FIG. 1.

A vacuum pump 104 is used to maintain a desired gas pressure in the process chamber 102, as well as to evacuate the post-processing gases from the chamber through an exhaust port 186 in a wall 158 of the chamber. In one embodiment, the vacuum pump 104 comprises a throttle valve (not shown) to control gas conductance in a path between the pump and the chamber. Pressure in the process chamber 102 is monitored by a pressure sensor 118. The measured value is used in a feedback loop to control the gas pressure during processing the wafer 128.

The showerhead 120 and the substrate pedestal 126 together form a pair of spaced apart electrodes. The reactor 100 is configured to perform a RIE process, when the source 121 applies the RF power to the substrate pedestal 126 while the showerhead 120 is electrically coupled to the ground reference 184, as depicted in FIG. 1. In this configuration, the substrate pedestal 126 is electrically isolated from the wall 158 using a spacer 192, formed, e.g., from alumina (Al$_2$O$_3$) and the like.

The plasma source 121 comprises a RF generator 122 and an associated matching network 123. The generator 122 may generally be tuned in a range from about 50 KHz to 13.56 MHz to produce up to 4000 W. In one embodiment, the RF generator 122 and the process chamber 102 are coupled to the same ground reference 184, such as the wall 158. The ground reference 184 may further be coupled to a common ground reference (not shown) of a semiconductor substrate processing system, which comprises the reactor 100.

When the plasma source 121 applies RF power to the substrate pedestal 126, the process gas 133 is energized to a plasma 155 in the reaction volume 154, defined by the showerhead 120 and the support pedestal 126. During a plasma etch process, the substrate pedestal 126 performs as a cathode, while the showerhead 120 performs as an anode of the process chamber 102.

Herein the anode is defined as an electrically conductive component of the chamber 102 (e.g., component formed from a metal) that is coupled to the ground reference 184, encompasses the reaction volume 154, and opposes the substrate pedestal 126. Further, the cathode is defined as an electrically conductive component of the chamber 102 that is coupled to the plasma source 121. During a plasma etch process, the cathode acquires, with respect to the anode, a negative potential.

In the depicted illustrative embodiment, the wall 158 and the showerhead 120 are also electrically coupled (or "short-circuited") by the respective contacting surfaces 159 and 153 and, as such, the wall 158 performs as an electrical extension of the anode. Further, in the depicted embodiment, the showerhead 120 is similarly coupled to the blocking plate 164 and the lid 112. In other embodiment (not shown), the showerhead 120 may be electrically isolated from the blocking plate 164 and the lid 112 using, e.g., a dielectric spacer that is similar to the spacer 192. Similarly, the showerhead 120 and the wall 158 may be electrically isolated (not shown) using such dielectric spacer. In any of such embodiments, the showerhead 120 and the plasma source 121 are coupled to the ground reference 184, and the showerhead 120 defines the anode in the process chamber 102.

Figure 4A:
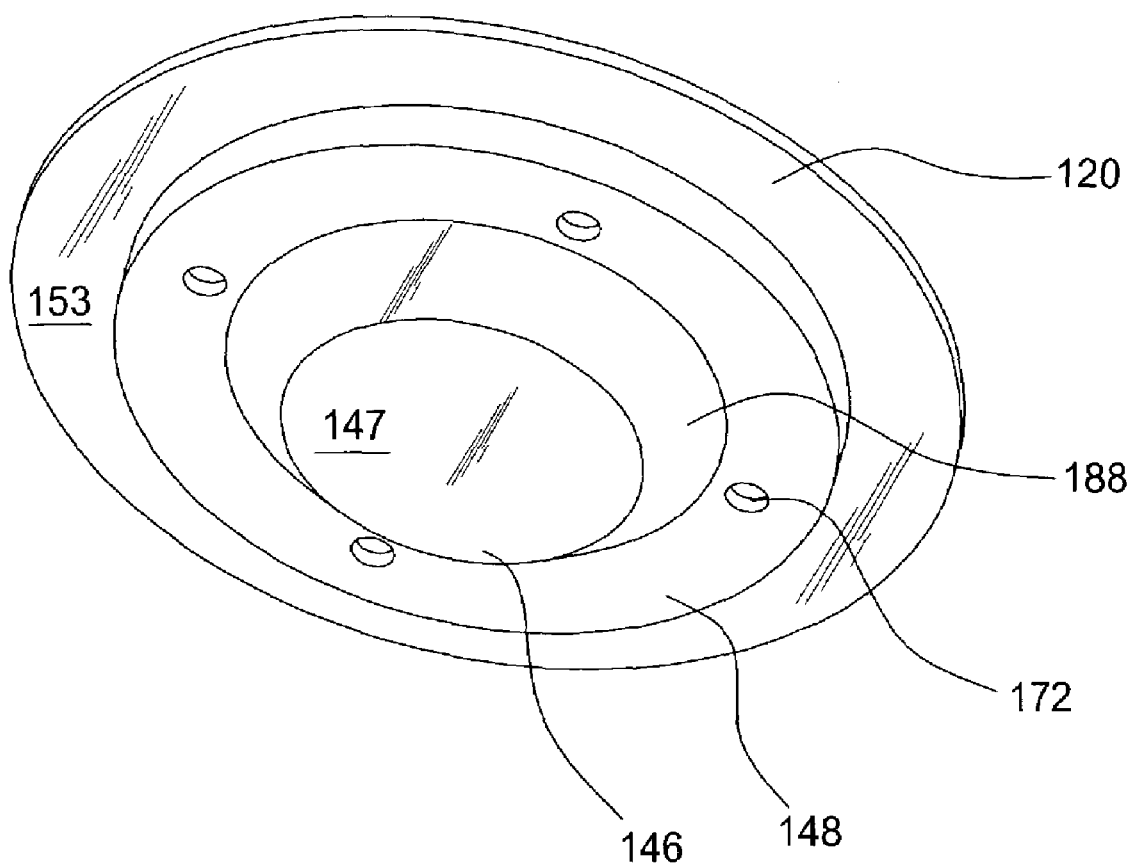
FIGS. 4A and 4B depict perspective views of exemplary embodiments of an anode electrode of the apparatuses of FIGS. 1 and 2, respectively.

The showerhead 120 comprises a first region 146 and a second region 148 that circumscribes the first region 146. The first region 146 protrudes from the second region 148 and is positioned substantially closer to the substrate pedestal 126 than the second region 148. In one embodiment, the first region 146 is located above a center portion 115 of the substrate pedestal 126 and concentrically aligned with the pedestal 126. Further, a surface 147 of the first region 146 is substantially parallel to an opposing support surface 127 of the substrate pedestal 126, while the first region 146 has a substantially circular shape in a direction that is parallel to the surface 147 (see FIG. 4A).

During a plasma etch process, the first region 146 increases an electric field at the center of the substrate 128. The increased electric field increases plasma density and the etch rate of a central portion of the substrate 128 and, as such, compensates for the wafer edge effect observed in the conventional RIE and MERIE chambers.

The second region 148 is located above a peripheral portion 117 of the substrate pedestal 126 at a distance 119 from the support surface 127 of the pedestal 126. In the depicted illustrative embodiment, the showerhead 120 comprises a recess 143, however, in other equally useful embodiments, the recess 143 is optional (e.g., the second region 148 may be extended to the wall 158 such that the surface 149 coincides with the surface 153). The second region 148 comprises at least one aperture 172 to disperse the process gas 133 from the second plenum 166 into the reaction volume 154. Illustratively, the second region 148 comprises four apertures 172, however, in other embodiments, a number of the apertures may be either less or greater than four.

Similar to the first region 146, the second region 148 is positioned substantially concentrically with the substrate pedestal 126 and the wafer 128. Further, a surface 149 of the second region 148 is substantially parallel to the support surface 127. The second region 148, as well as first region 146, performs as the anode of the process chamber 102. However, the second region 148 is located farther from the substrate pedestal 126 than the first region 146, and, as such, the electric field in the peripheral portion 117 of the substrate pedestal 126 is weaker, than in the central portion 115 of the pedestal. As discussed above, during the etch process, it results in a lower etch rate near the edge of the wafer 128 than in the center of the wafer.

In one embodiment, a sidewall 188 of the first region 146 has a substantially circular form factor, e.g., a cylindrical, conical, and the like. In the depicted illustrative embodiment, the sidewall 188 has a conical form factor that is characterized by an angle 125 between the sidewall 188 and the surface 147. The angle 125 is generally chosen between 45 and 90 degrees. A diameter 170 of the surface 147 and a distance 129 between the surfaces 127 and 147 may be between 200 and 300 mm and 10 and 50 mm, respectively. Further, the distance 119 between the second region 148 and the support surface 127 is between 50 and 100 mm.

In one exemplary embodiment, when the referred to above eMAX reactor is used to perform a MERIE etch process, a distance between the support surface 127 and an opposing surface of a conventional showerhead is approximately 98 mm. In the present invention, the showerhead 120 comprises the first region 146 having the distance 129 to the support pedestal 126 of between 10 and 50 mm and a diameter 170 between 200 and 300 mm. In one exemplary embodiment, the distance 129 is about 36 mm, while the diameter 170 is about 102 mm, and the angle 125 is about 90 degrees. In this embodiment, a height of the first region 146, which is defined as a difference between the distances 119 and 170, is about 62 mm. As such, in the reactor 100, the distance between the support pedestal 126 (cathode) and the first region 146 of showerhead 120 (anode) is reduced from 98 mm (conventional e-MAX reactor) to about 36 mm.

The regions 146 and 148 and the sidewall 188 may be formed from at least one conductive material such as a metal, e.g., aluminum (Al), stainless steel, and the like. In one embodiment, the regions 146 and 148 may be formed from the same material and/or formed as a single part. In a further embodiment, the entire showerhead 120 may be formed from the same material and/or formed as a single part.

Figure 2:
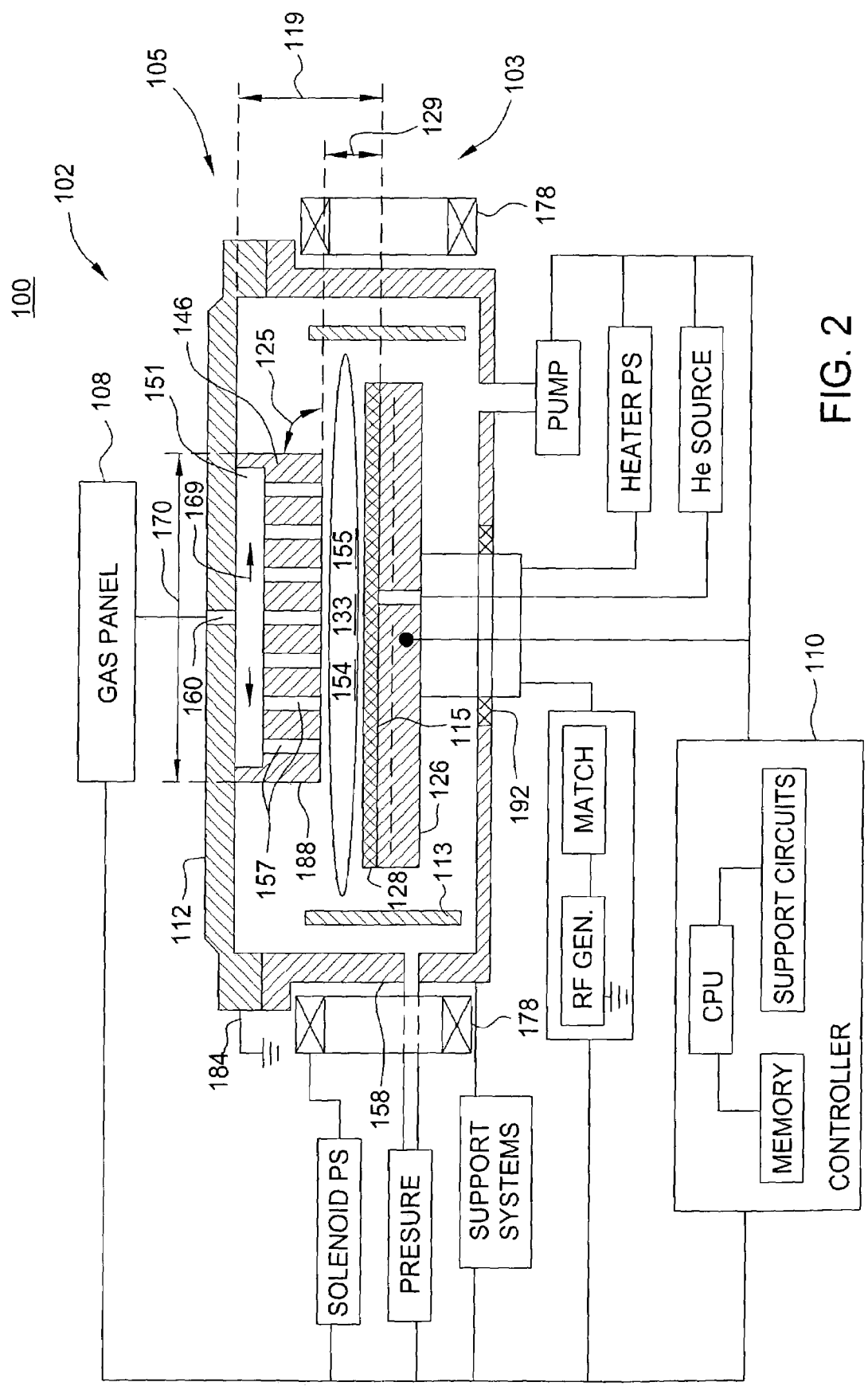
FIG. 2 depicts a schematic cross-sectional diagram of another embodiment of the apparatus of FIG. 1.

In an alternative embodiment of the invention, the blocking plate 164 and the showerhead 120 are not present in the process chamber 102 (FIG. 2). In the depicted embodiment, the first region 146 is circumscribed by a region 163 of the lid 112 and comprises a gas mixing plenum 151. The mixing plenum 151 is in fluid communication with the inlet port 160. The process gas 133 diffuses radially across the mixing plenum 151 towards openings (gas injectors) 157, as indicated by arrows 169. Through a plurality of the gas injectors 157, the process gas 133 is further dispersed into the reaction volume 154.

Figure 4B:
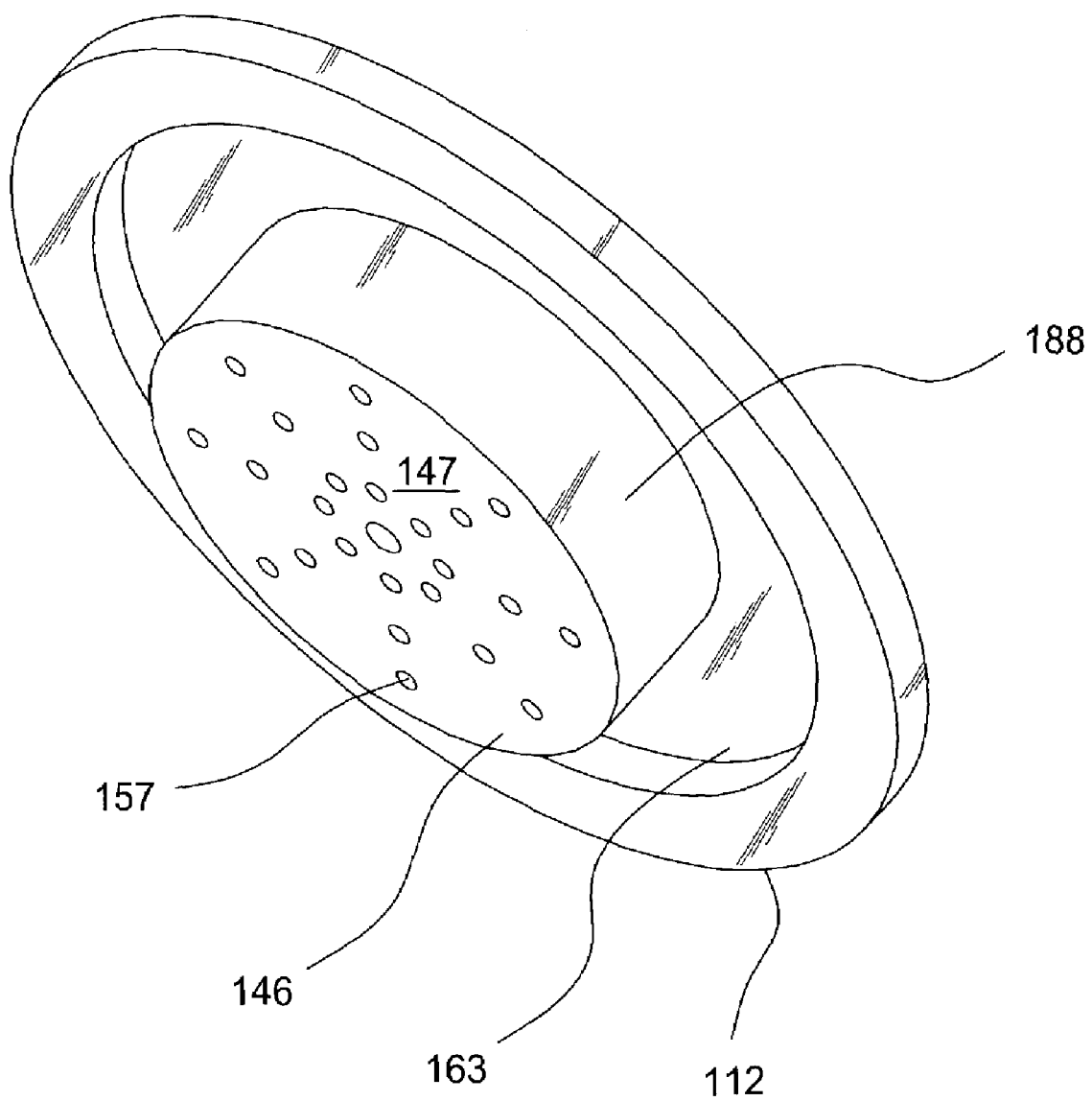

In operation, the lid 112 and the first region 146 are coupled to the ground reference 184 and, together, define the anode in the process chamber 102. As such, the first region 146 performs as the anode and, additionally, as a gas distribution plate that disperses the process gas 133 in the process chamber 102 (see FIG. 4B). In the apparatus of FIG. 2, the first region 146 and the lid 112 may also be formed from at least one conductive material (e.g., aluminum, stainless steel, and the like). Similar to the apparatus of FIG. 1, the first region 146 increases the electric field at the center of the substrate 128 with respect to the electric field at the periphery of the wafer and compensates for the wafer edge effect, as discussed above. The present invention can also be practiced using plasma etch chambers having other arrangements for delivering the process gas into the chamber.

Figure 3:
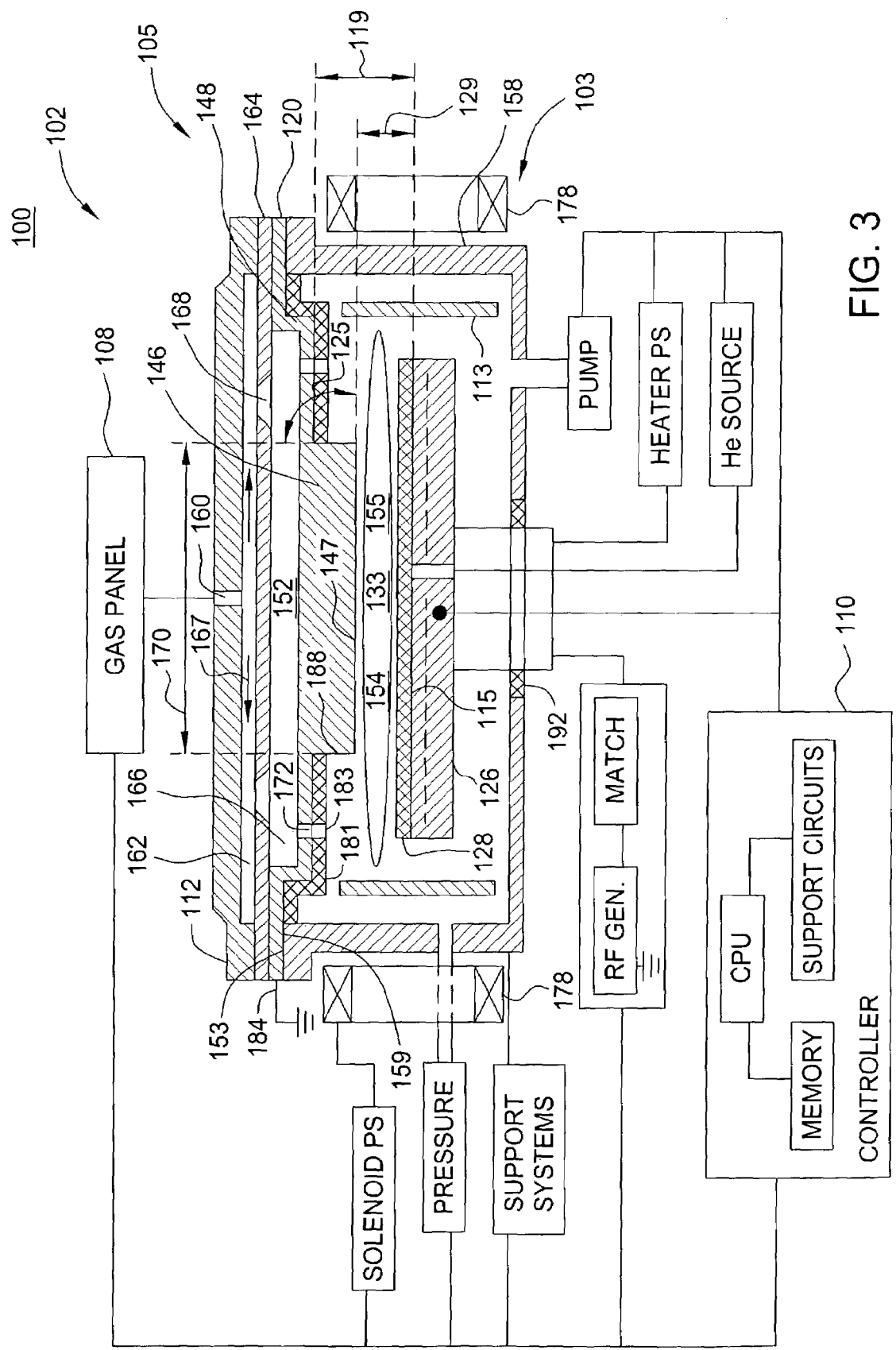
FIG. 3 depicts a schematic cross-sectional diagram of yet another embodiment of the apparatus of FIG. 1.

In another exemplary embodiment, the showerhead 120 comprises a dielectric ring 181 that protects the second region 148 during an etch process from accumulating by-products of the etch process (FIG. 3). In one illustrative embodiment, the dielectric ring 181 circumscribes the first region 146. The dielectric ring 181 further comprises a plurality of gas passages (nozzles) 183. In the depicted embodiment, the gas nozzles 183 are aligned with the gas injectors 172. The gas nozzles 183 facilitate passage for the process gas 133, dispersed by the gas injectors 172, into the reaction volume 154 of the process chamber 102. The dielectric ring 181 may be formed from material such as quartz, alumina, and the like having a thickness between 10 and 90 mm, specifically, about 60 mm. The dielectric ring 181 may be attached to the showerhead 120 using conventional fasteners (not shown), such as a mounting collar, screws, and the like.

In yet another exemplary embodiment (not shown) when the blocking plate 164 and the showerhead 120 are not present in the process chamber 102 (discussed above in reference to FIG. 2), similar to the embodiment depicted in FIG. 3, the lid 112 may comprise the dielectric ring 181 to protect the region 163 from accumulating by-products of the etch process. In this embodiment, the process gas 133 is dispersed into the reaction volume 154 through the gas injectors 157 in the first region 146 and, as such, the gas nozzles 183 in the dielectric ring 181 are optional.

The plasma magnetizing solenoids 178 generally are positioned near the process chamber 102. During the plasma etch process, at least one such solenoid 178 is used to magnetize the plasma 155 in the reaction volume 154 to increase the etch rate and/or to decrease the etch rate non-uniformity. In the depicted embodiment, four solenoids 178 surround the process chamber 102, i.e., one torroidal magnet is located on each side of the chamber.

The process chamber 102 also comprises conventional equipment for retaining and releasing the wafer, detection of an end of a process, internal diagnostics, and the like. Such equipment is collectively depicted in FIG. 1 as support systems 107.

The controller 110 comprises a central processing unit (CPU) 124, a memory 116, and a support circuit 114. The CPU 124 may be of any form of a general purpose computer processor that can be used in an industrial setting. The software routines can be stored in the memory 116, such as random access memory, read only memory, floppy or hard disk drive, or other form of digital storage. The support circuit 114 is conventionally coupled to the CPU 124 and may comprise cache, clock circuits, input/output subsystems, power supplies, and the like.

The software routines, when executed by the CPU 124, transform the CPU into a specific purpose computer (controller) 110 that controls the reactor 100 such that the processes are performed in accordance with the present invention. The software routines may also be stored and/or executed by a second controller (not shown) that is located remotely from the reactor 100.

In exemplary applications, the processes performed in the reactor 100 included etching of dielectric materials such as, e.g., silicon dioxide ($SiO_2$), silicon nitride (SiN), and the like using the process gas comprising at least one of trifluoromethane ($CHF_3$), carbon tetrafluoride ($CF_4$), fluorocarbon ($C_4F_6$), oxygen ($O_2$), argon (Ar) and the like. In such applications, the discussed above inventive etch reactors provided the etch rate non-uniformity in a range from 4 to 5%, or approximately 2-3 times better, than conventional RIE or MERIE reactors.

In one illustrative application, when the invention was used to etch a layer of silicon dioxide, the inventive reactor 100 provided trifluoromethane at a rate of about 30 sccm, as well as carbon tetrafluoride at a rate of about 60 sccm and argon at a rate of between 200 and 500 sccm. Further, the reactor 100 applied about 3000 W of RF bias power at 13.56 MHz, energized the solenoids 178 to magnetize the plasma to about 30 G, and maintained a wafer temperature at about 15 degrees Celsius and a pressure in the process chamber at about 50 mTorr.

The recipe accomplished the etch rate non-uniformities of about 4.6% and 4.1% when was practiced in the apparatus of FIG. 1 and FIG. 2, respectively. Such results represent approximately a 2-times improvement from the etch rate non-uniformity of about 10.7% that was achieved using conventional MERIE reactors.

Although the forgoing discussion referred to an apparatus for plasma etching a layer of material using a MERIE reactor, other plasma apparatuses and processes can benefit from the invention. The invention can be practiced in other semiconductor processing systems wherein the processing parameters may be adjusted to achieve acceptable characteristics by those skilled in the art by utilizing the teachings disclosed herein without departing from the spirit of the invention.

While foregoing is directed to the illustrative embodiment of the present invention, other and further embodiments of the invention may be devised without departing from the basic scope thereof, and the scope thereof is determined by the claims that follow.

What is claimed is:

1. Apparatus for plasma etching a layer of material upon a substrate, comprising:
    an electrode comprising a first region protruding from a second region, wherein the second region, circumscribing the first region and covering at least part of the substrate, defines a first plane, and the first region, extending from the first plane and covering the center portion of the substrate, defines a second plane which is closer to the substrate than the first plane; and
    a dielectric ring circumscribing the first region, wherein the dielectric ring has gas distribution nozzles.

2. The apparatus of claim 1, wherein the first region is a cylinder.

3. The apparatus of claim 2, wherein the cylinder is centrally located within the second region.

4. The apparatus of claim 1, wherein the second region has gas distribution apertures.

5. The apparatus of claim 1, wherein the first region has a plurality of gas distribution apertures.

6. The apparatus of claim 1, wherein the process chamber further comprises at least one solenoid or magnet to magnetize the plasma in the chamber.

7. The apparatus of claim 6, wherein the plasma source comprises a source of radio-frequency power of up to 4000 W tunable in a range between 50 kHz and 13.56 MHz.

8. Apparatus for plasma etching a layer of material upon a substrate, comprising:
    a process chamber having an electrode and a cathode;
    a plasma source coupled to the cathode; and
    a source of etchant gas, wherein the electrode comprises a first region protruding from a second region, the second region, circumscribing the first region and covering at least part of the substrate, defines a first plane, and the first region, extending from the first plane and covering the center portion of the substrate, defines a second plane which is closer to the substrate than the first plane; and
    a dielectric ring circumscribing the first region, wherein the dielectric ring has passages for the etchant gas.

9. The apparatus of claim 8, wherein the process chamber further comprises at least one solenoid or magnet to magnetize the plasma in the chamber.

10. The apparatus of claim 8, wherein the plasma source comprises a source of radio-frequency power of up to 4000 W tunable in a range between 50 kHz and 13.56 MHz.

11. The apparatus of claim 8, wherein the first region is a cylinder.

12. The apparatus of claim 11, wherein the cylinder is centrally located within the second region.

13. The apparatus of claim 8, wherein the second region has apertures to distribute the etchant gas.

14. The apparatus of claim 8, wherein the first region has a plurality of apertures to distribute the etchant gas.

15. An apparatus for plasma etching a layer of material upon a substrate, comprising:
    an electrode comprising a first region covering the center portion of the substrate and a second region, circumscribing the first region and covering at least part of the substrate, wherein the first region is closer to the substrate than the second region and is adapted to form an electric field having a magnitude that is greater than an electric field that is formed by the second region; and
    a dielectric ring circumscribing the first region, wherein the dielectric ring has gas distribution nozzles.

16. The apparatus of claim 15 wherein the second region defines a plane and the first region protrudes from the plane.

17. The apparatus of claim 16 wherein the cylinder is centrally located within the second region.

18. The apparatus of claim 16, wherein the second region has gas distribution apertures.

19. The apparatus of claim 16, wherein the first region has a plurality of gas distribution apertures.

20. The apparatus of claim 15, wherein the process chamber further comprises at least one solenoid or magnet to magnetize the plasma in the chamber.

* * * * *